(12) United States Patent
Frisco et al.

(10) Patent No.: US 11,022,895 B2
(45) Date of Patent: Jun. 1, 2021

(54) LITHOGRAPHIC APPARATUS ADJUSTMENT METHOD

(71) Applicant: ASML Netherlands B.V., Veldhoven (NL)

(72) Inventors: Pierluigi Frisco, Eindhoven (NL); Giovanni Imponente, Eindhoven (NL); James Robert Downes, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/644,135

(22) PCT Filed: Aug. 14, 2018

(86) PCT No.: PCT/EP2018/071981
§ 371 (c)(1),
(2) Date: Mar. 3, 2020

(87) PCT Pub. No.: WO2019/042757
PCT Pub. Date: Mar. 7, 2019

(65) Prior Publication Data
US 2020/0272059 A1   Aug. 27, 2020

(30) Foreign Application Priority Data
Sep. 4, 2017   (EP) .................................... 17189220

(51) Int. Cl.
*G03B 27/54* (2006.01)
*G03F 7/20* (2006.01)
(52) U.S. Cl.
CPC .................................. *G03F 7/706* (2013.01)

(58) Field of Classification Search
CPC ...... G03F 7/70525; G03F 7/706; G03F 7/705; G03F 7/70633
See application file for complete search history.

(56) References Cited

U.S. PATENT DOCUMENTS

| | | | |
|---|---|---|---|
| 7,652,758 B2 | 1/2010 | Park et al. | |
| 2019/0227441 A1 | 7/2019 | Imponente et al. | |

FOREIGN PATENT DOCUMENTS

| | | |
|---|---|---|
| EP | 1217448 A2 | 6/2002 |
| EP | 1246014 A1 | 10/2002 |
| EP | 1630617 A2 | 3/2006 |
| WO | WO 2017/067748 A1 | 4/2017 |

OTHER PUBLICATIONS

International Search Report and Written Opinion of the International Searching; Authority directed to related International Patent Application No. PCT/EP2018/071981, dated Oct. 19, 2018; 9 pages.
International Preliminary Report on Patentability directed to related International Patent Application No. PCT/EP2018/071981, dated Mar. 10, 2020; 7 pages.

*Primary Examiner* — Peter B Kim
(74) *Attorney, Agent, or Firm* — Sterne, Kessler, Goldstein & Fox P.L.L.C.

(57) ABSTRACT

A method comprising determining aberrations caused by each lithographic apparatus of a set of lithographic apparatuses, calculating adjustments of the lithographic apparatuses which minimize differences between the aberrations caused by each of the lithographic apparatuses, and applying the adjustments to the lithographic apparatuses, providing better matching between the aberrations of patterns projected by the lithographic apparatuses.

16 Claims, 6 Drawing Sheets

LITHOGRAPHIC APPARATUS ADJUSTMENT METHOD

CROSS-REFERENCE TO RELATED APPLICATIONS

This application claims priority of EP application 17189220.1 which was filed on Sep. 4, 2017 and which is incorporated herein in its entirety by reference.

FIELD

The present invention relates to a method which may be used to adjust lithographic apparatuses.

BACKGROUND

A lithographic apparatus is a machine that applies a desired pattern onto a target portion of a substrate. Lithographic apparatuses can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed.

A semiconductor fabrication plant used to make integrated circuits will include many lithographic apparatus, typically between 10 and 50. A semiconductor substrate (which may be referred to as a wafer) is exposed to different patterns in series in order to form multiple patterned layers on the substrate. The number of patterned layers may typically be 30 or more. Each projected pattern is aligned with the pattern projected onto the previous layer. This ensures that structures formed by the layers connect to each other properly. If the layers are not aligned then integrated circuits formed on the substrate will not function correctly.

A problem which arises is that a projection system of each lithographic apparatus includes some aberration, and this causes some distortion of the pattern projected by that lithographic apparatus. Aberration and associated pattern distortion may also be caused by a support structure which holds the mask and by a substrate table which holds the substrate. The aberrations caused by each lithographic apparatus are different, and may be referred to as aberration fingerprints. In some instances the distortions caused by the aberration fingerprints may reduce the accuracy with which it is possible to project successive layers of patterns onto a substrate. This may in turn cause semiconductor devices formed on the substrate to be non-functional.

It is desirable to provide, for example, a method which obviates or mitigates one or more of the problems of the prior art, whether identified herein or elsewhere.

SUMMARY

According to a first aspect of the invention, there is provided a method comprising determining aberrations caused by each lithographic apparatus of a set of lithographic apparatuses, calculating adjustments of the lithographic apparatuses which minimize differences between the aberrations caused by each of the lithographic apparatuses, and applying the adjustments to the lithographic apparatuses.

The invention provides better matching between the aberrations of patterns projected by the lithographic apparatuses. As a result the patterns align with each other more accurately when they are projected onto substrates. In other words, overlay of the patterns is improved.

Calculating adjustments of the lithographic apparatuses may use a merit function.

Calculating adjustments of the lithographic apparatuses may use an optimization algorithm.

The optimization algorithm may be an artificial intelligence algorithm.

The optimization algorithm may be an evolutionary algorithm, a genetic algorithm or a simulated annealing algorithm.

The optimization algorithm may modify the merit function during the calculation of the adjustments.

Calculating adjustments of the lithographic apparatuses may comprise calculating an average of the aberrations caused by all of the lithographic aberrations, determining the worst performing lithographic apparatus, then calculating an adjustment of that lithographic apparatus which brings aberrations caused by that lithographic apparatus closer to the average.

The calculation may be iterated multiple times

The calculated adjustments may increase an average aberration caused by at least one lithographic apparatus, relative to an average aberration caused by that lithographic apparatus before the method was used.

The method may be applied during setup of the lithographic apparatuses. The aberrations may be determined via measurements performed during setup of the lithographic apparatuses.

The method may be applied periodically.

The method may use a moving average of the aberrations caused by the lithographic apparatuses.

The method may be applied between production exposures of substrates. The aberrations may be measured periodically.

The aberrations may be measured by exposing reference substrates to patterns using the lithographic apparatuses and then measuring the exposed patterns.

The aberrations may be measured using a sensor located within the lithographic apparatuses.

The method may be applied between exposures of target areas of a substrate.

The method may comprise minimising differences between the lithographic apparatuses for selected Zernikes.

The selected Zernikes may be Zernike Z2 and Zernike Z3.

The selected Zernikes may be Zernikes from Z2 up to a predetermined Zernike number.

The predetermined Zernike number may be greater than 30.

Weightings may be applied to the Zernikes.

The weightings may correspond with the sensitivity of overlay to the Zernikes.

According to a second aspect of the invention there is provided a computer program comprising computer readable instructions configured to cause a computer to carry out a method according to the first aspect of the invention.

According to a third aspect of the invention there is provided a computer readable medium carrying a computer program according to the third aspect of the invention.

According to a fourth aspect of the invention there is provided a computer apparatus comprising a memory storing processor readable instructions, and a processor arranged to read and execute instructions stored in said memory, wherein said processor readable instructions comprise instructions arranged to control the computer to carry out a method according to the first aspect of the invention.

According to a fifth aspect of the invention there is provided one or more integrated circuits configured to carry out a method according to the first aspect of the invention.

The one or more integrated circuits may comprise one or more field-programmable gate arrays (FPGAs).

According to a sixth aspect of the invention there is provided a set of lithographic apparatuses, each lithographic apparatus comprising an illumination system for providing a beam of radiation, a support structure for supporting patterning device, the patterning device serving to impart the radiation beam with a pattern in its cross-section, a substrate table for holding a substrate, and a projection system for projecting the patterned radiation beam onto a target portion of the substrate, wherein each lithographic apparatus is adjustable to adjust aberrations caused by the lithographic apparatus when projecting patterns, and wherein the apparatus further comprises a processor configured to determine aberrations caused by each lithographic apparatus of the set of lithographic apparatuses, calculate adjustments of the lithographic apparatuses which minimize differences between the aberrations caused by each of the lithographic apparatuses, and applying the adjustments to the lithographic apparatuses.

The invention provides better matching between the aberrations of patterns projected by the lithographic apparatuses. As a result the patterns align with each other more accurately when they are projected onto substrates. In other words, overlay of the patterns is improved.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
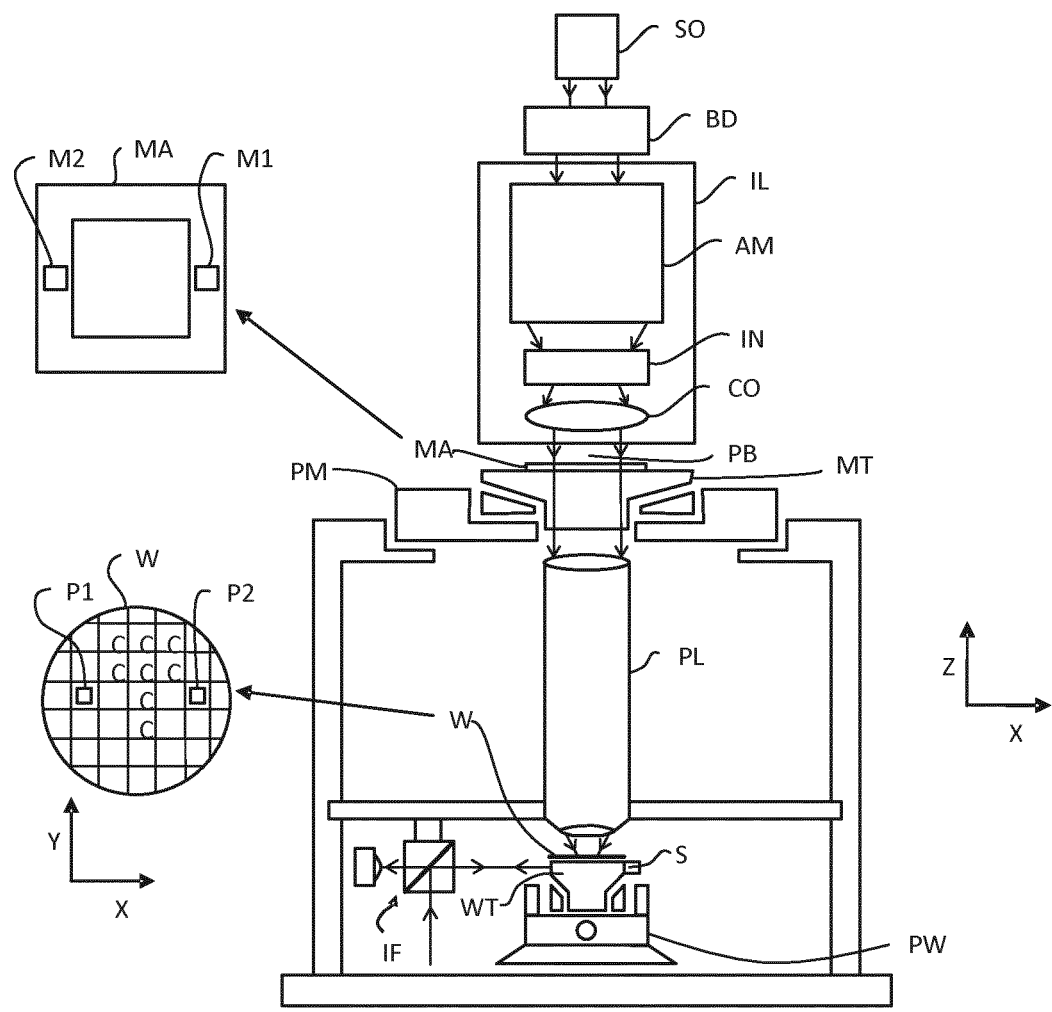
FIG. 1 depicts a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" lithographic apparatuses the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate Immersion techniques are well known in the art for increasing the numerical aperture of projection systems.

FIG. 1 schematically depicts a lithographic apparatus according to a particular embodiment of the invention. The apparatus comprises:

an illumination system (illuminator) IL to condition a beam PB of radiation (e.g. DUV radiation or EUV radiation).

a support structure (e.g. a support structure) MT to support a patterning device (e.g. a mask) MA and connected to first positioning device PM to accurately position the patterning device with respect to item PL;

a substrate table (e.g. a wafer table) WT for holding a substrate (e.g. a resist coated wafer) W and connected to second positioning device PW for accurately positioning the substrate with respect to item PL; and a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a reflective mask or programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device (e.g. mask) MA, which is held on the support structure MT. Having traversed the patterning device MA, the beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Each patterned layer of a semiconductor substrate may be projected using a different lithographic apparatus. Some of the lithographic apparatuses may be designed to project very high resolution patterns (e.g. with a critical dimension of less than 50 nm, e.g. less than 40 nm, e.g. less than 20 nm). These lithographic apparatuses may for example be used to form the first few layers on the substrate. Other lithographic apparatuses may be designed to project patterns with lower resolution, for example 100 nm or more (e.g. up to 300 nm). Such lithographic apparatuses are typically used to project the subsequent layers on the substrate because these subsequent layers do not require as high resolution as the first few layers (the subsequent layers may for example provide connections between transistors or other components formed by the first few layers). In one example, a lithographic fabrication plant may include DUV lithographic apparatuses in which liquid is provided between the projection lens and the substrate (referred to as immersion lithographic apparatuses), and other DUV lithographic apparatuses in which no liquid is present between the projection lens and the substrate (referred to as dry lithographic apparatuses). The immersion lithographic apparatuses may be used to project the first few patterned layers onto a substrate, and the dry lithographic apparatuses may be used to project subsequent patterned layers. In another example, a lithographic fabrication plant may include EUV lithographic apparatuses, immersion DUV lithographic apparatuses and dry DUV lithographic apparatuses.

It is desirable for lithographic apparatuses to project a pattern onto a substrate without introducing aberrations into the projected pattern. However, in practice a lithographic apparatus will not operate perfectly but will instead introduce some aberrations into the projected pattern. The projection system of the lithographic apparatus may be adjusted to reduce such aberrations but nevertheless residual aberrations will remain. The aberrations caused by the projection system may be referred to as an aberration fingerprint of the lithographic apparatus. The aberration fingerprint of each lithographic apparatus will be different. This applies between lithographic apparatuses of the same type (e.g. immersion lithographic apparatus). It also applies between lithographic apparatuses of different types (e.g. between immersion and dry lithographic apparatuses and between EUV apparatus and DUV apparatuses). It is conventional to try to reduce the aberration fingerprint of each lithographic apparatus to a minimum.

The aberration fingerprint of a lithographic apparatus may be expressed as a sum of Zernike polynomial functions. The Zernike functions are generally referred to simply as Zernikes, and are identified using the nomenclature Z2, Z3, Z4, etc. The aberration fingerprint of each lithographic apparatus may for example be reduced by minimizing the size of a specific aberration Zernike such as Z2 or Z3. Alternatively, the aberration fingerprint may be reduced by minimising an average taken over a range of Zernikes. Aberration fingerprints, expressed as Zernikes, will typically be N-dimensional, with N being over 30, e.g. 36, 64 or up to 100.

Figure 2:
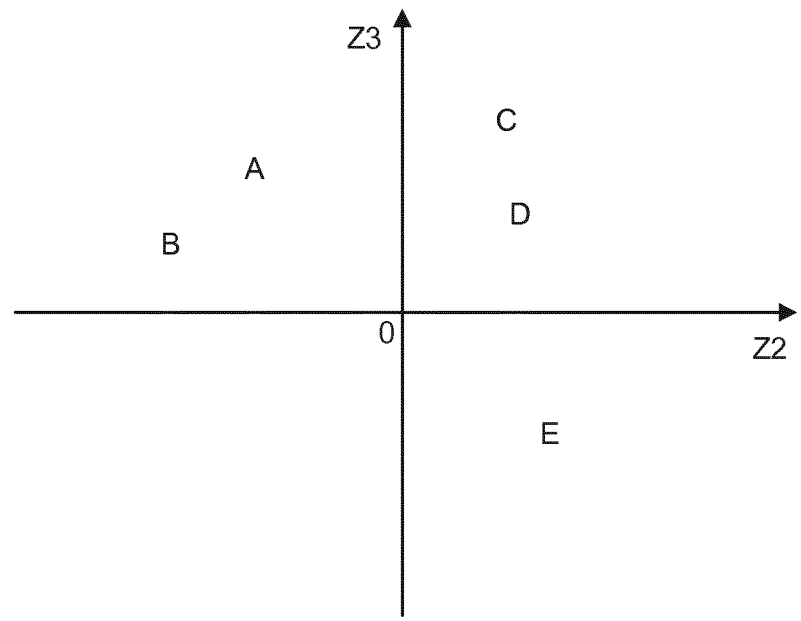
FIG. 2 is a graph which schematically depicts aberrations caused by a set of five lithographic apparatuses.

FIG. 2 schematically depicts the aberration fingerprints of five different lithographic apparatuses A-E. The lithographic apparatuses are depicted on a graph which shows the Zernike Z2 aberration on the horizontal axis and the Zernike Z3 aberration on the vertical axis. FIG. 2 is merely schematic and no scales are provided on the axes. As may be seen, each lithographic apparatus has an aberration fingerprint which includes a Z2 component and a Z3 component. This is a simplified example for illustrative purposes, and in practice each lithographic apparatus may have an N-dimensional aberration fingerprint with N typically being over 30. The same applies in connection with other illustrated embodiments.

Figure 3:
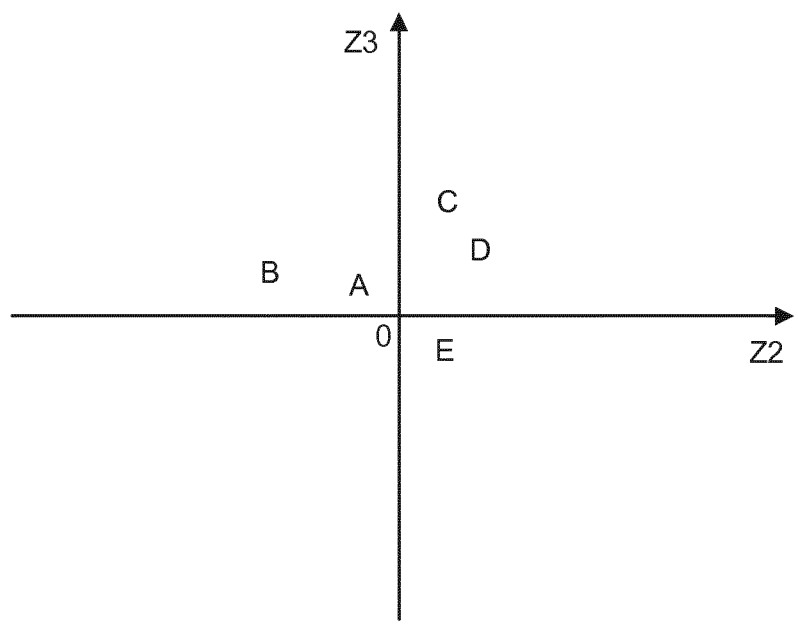
FIG. 3 is a graph which schematically depicts reductions of the aberrations using a known method.

In a conventional prior art approach the projection system of each lithographic apparatus A-E would be adjusted to reduce the aberrations Z2 and Z3 (in the simplified example) to being as close to zero as possible for each lithographic apparatus. This would be done when the lithographic apparatuses were installed in a lithographic fabrication plant during an installation process which may be referred to as setup. The result of such an adjustment is depicted in FIG. 3. As may be seen, the aberrations Z2 and Z3 have been reduced for each lithographic apparatus.

Figure 4:
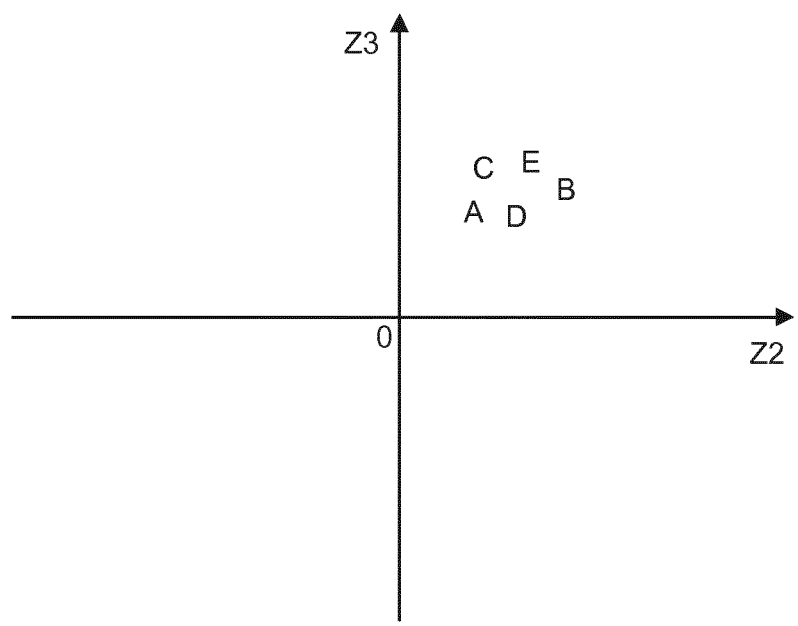
FIG. 4 is a graph which schematically depicts reductions of the aberrations using an embodiment of the invention.

A result achieved using an embodiment of the invention is schematically depicted in FIG. 4. In this embodiment, instead of adjusting the aberrations Z2, Z3 to be as close to zero as possible, they are instead adjusted such that they are as similar to each other as possible for the five lithographic apparatuses A-E. In other words, the spread of Z2 and Z3 aberration values is collectively reduced to a minimum. As is schematically depicted in FIG. 4, the five lithographic apparatuses A-E have Z2 and Z3 aberration values which are close to each other. The Z2 and Z3 aberration values for at least some of the lithographic apparatuses are larger than would be the case if an attempt had been made to reduce these values to be as close to zero as possible. However, the Z2 and Z3 values are all similar to each other. In general, the aberration fingerprints of the lithographic apparatuses A-E are similar to each other. This is advantageous because it provides better matching between the aberrations of patterns projected by the lithographic apparatuses A-E, and as a result the patterns align with each other more accurately when they are projected onto substrates. In other words, overlay of the patterns is improved.

One method of achieving a minimal spread of aberration fingerprints for the five lithographic apparatuses A-E is as follows:

Set up a first lithographic apparatus A, and, during the setup, attempt to reduce a root mean square (RMS) of Z2 and Z3 to zero, resulting in a residual aberration fingerprint AFA.

Set up a second lithographic apparatus B, and, during the setup, attempt to reduce the RMS of Z2 and Z3 for the second lithographic apparatus B to zero, resulting in a second residual aberration fingerprint AFB.

Compare AFA and AFB and use an algorithm to calculate adjustments of the lithographic apparatuses A and B, which will minimize differences between AFA and AFB.

Apply the adjustments to the first and second lithographic apparatuses A and B.

Set up a third lithographic apparatus C, and, during the setup, attempt to minimize Z2 and Z3 for the third lithographic apparatus C to zero, resulting in a third aberration fingerprint AFC.

Compare the aberration fingerprints AFA, AFB, AFC and use an algorithm to calculate adjustments of the lithographic apparatuses A, B and C to minimize the difference between the aberration fingerprints.

Apply the adjustments to first, second and third lithographic apparatuses A, B and C.

Repeat the above three steps for a fourth lithographic apparatus D and for a fifth lithographic apparatus E.

The above method may be considered to include a moving average, because an average aberration fingerprint changes each time a new lithographic apparatus is added to the set of lithographic apparatuses. The algorithm which is used to minimize the difference between the aberration fingerprints AFA-E of lithographic apparatuses attempts to minimize a merit function which is a measurement of an average (or cumulative) distance between the aberration fingerprints of the different lithographic apparatuses A-E. The merit function may for example be the root mean square of the differences of the Zernike Z2 values from an average value, and the differences of the Zernike Z3 values from an average value, for all of the lithographic apparatuses A-E. Other merit functions may be used.

In an embodiment, the distances between Zernikes up to a given number may be minimized (instead of only minimizing the distance between Z2 values and between Z3 values). The distances between Zernike values may for example be minimized for 30 Zernikes or more, e.g. up to Z36, up to Z64 or up to Z100 or more. The merit function may for example be the root mean square of the distances between Zernike values and an average Zernike value for each of the lithographic apparatuses A-E, determined for each Zernike. Other merit functions may be used.

Examples of other merit functions are minimizing the root mean square of the distances between the aberrations of the lithographic apparatuses A-E. In one approach this may be done by generating a sum consisting of the differences between the lithographic apparatuses A-E for each Zernike, and seeking to minimize that sum.

Each Zernike in a merit function may be given the same weighting when performing a method according to an embodiment of the invention. Alternatively, different weightings may be given to different Zernikes in a merit function. For example, Zernikes (aberrations) which primarily influence overlay, such as Z2 and Z3 may be given a greater weighting than Zernikes such as Z4 which primarily influence focus. In an embodiment, the method may include modifying weightings given to different Zernikes in a merit function. This may be done using an optimization algorithm which also seeks to minimize the merit function (e.g. as described further below in connection with FIG. 5).

An example of an alternative merit function is minimizing the distances between the fingerprints of the lithographic apparatuses for particular positions in the target portions C (see FIG. 1). The target portions C may also be referred to as exposure fields.

An optimization algorithm used to minimize the differences between aberration fingerprints of the lithographic apparatus may use artificial intelligence, e.g. an evolutionary algorithm, a genetic algorithm or simulated annealing. Alternatively, algorithms may be used which do not use artificial intelligence. For example, a conventional lens model which models the effect of adjustments upon an aberration fingerprint may be used In one embodiment, a model used during setup of the lithographic apparatuses A-E may be a quadratic programming method. The quadratic programming method may optimize for aberration in the exposure fields of the lithographic apparatuses A-E, together with constraints arising from manipulators which can be used to adjust the lithographic apparatuses (e.g. manipulators which are used to adjust lenses of the projection systems). A combined setup model including all manipulators of all lithographic apparatuses and a corresponding merit function may be generated.

The lithographic apparatuses A-E may be steered towards a target performance using a merit function for each lithographic apparatus individually. Key performance indicators (KPIs) of the set of lithographic apparatuses A-E may be determined during this process. The key performance indicators may be generated using functions which receive Zernike values as inputs and which output a root mean square, maximum value, minimum value, maximum value over the exposure field, or some other value. The key performance indicators may be Zernike values themselves. The merit function may be a sum of 'terms' each of which has a parameter, the higher the parameter the more important that term in the merit function. The parameters of the individual merit functions may for example be in part selected by the user. For example the user may select Zernike Z3 as being particularly important and Zernike Z2 as less important, etc. Other parameters of the merit function may be selected by the evolutionary algorithm. An optimization algorithm such as an evolutionary algorithm may adjust weights applied to parameters of the merit function. By looking at changes in the corresponding KPIs when adjusting weights applied to parameters of the individual merit functions, the optimization algorithm can search for the best set of weighted parameters to achieve the best matching of KPIs across the set of lithographic apparatuses. In this way the optimization of each lithographic apparatus retains an original setup model with a tuned merit function, but the set of lithographic apparatuses is optimized via tuning of the merit functions of individual lithographic apparatuses.

In embodiments described herein, an optimization algorithm may be used to minimize the differences between aberration fingerprints of the lithographic apparatuses. The optimization algorithm may be an artificial intelligence algorithm. The optimization algorithm may, for example, be an evolutionary algorithm, a genetic algorithm or a simulated annealing algorithm. The optimization algorithm may comprise an algorithm that involves techniques such as, for example, quadratic programming.

Figure 5:
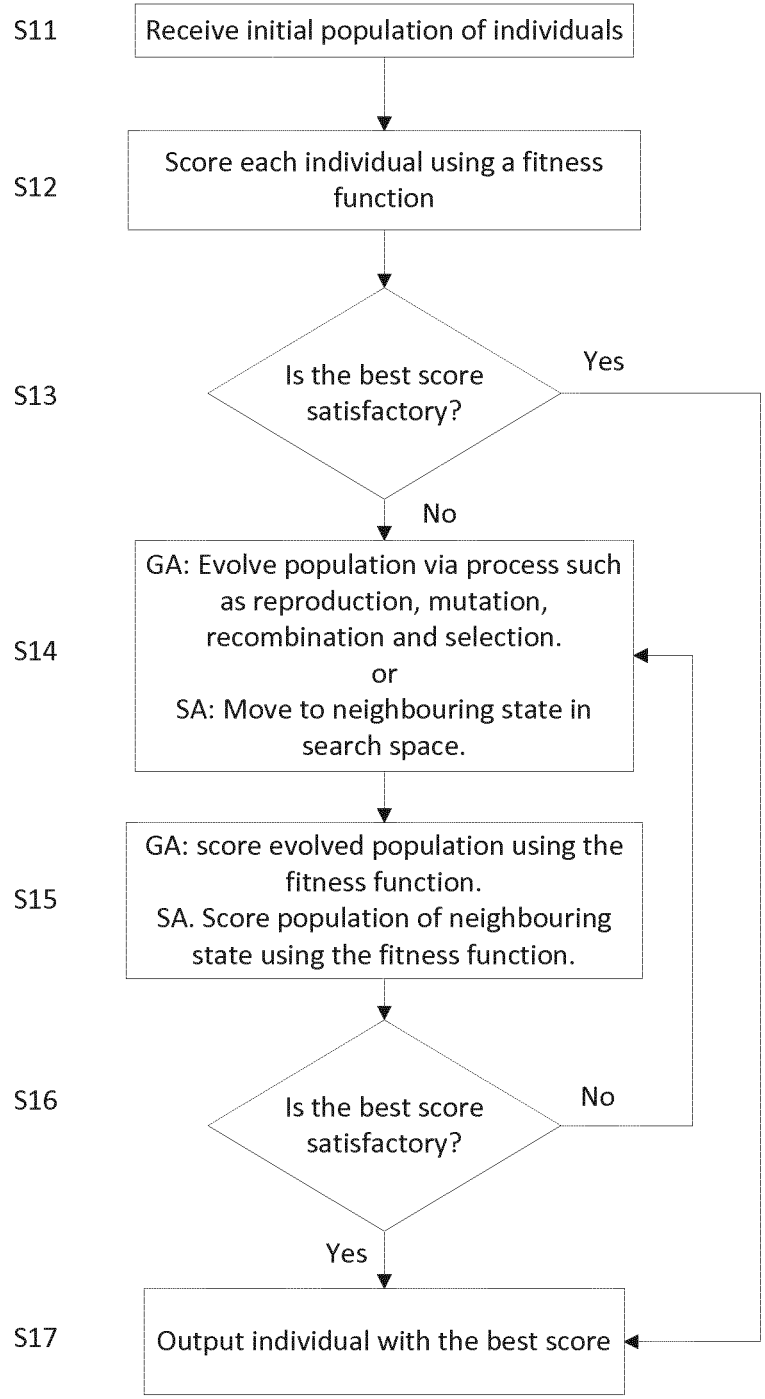
FIG. 5 is a flowchart of an optimization algorithm which may form part of an embodiment of the invention.

FIG. 5 is a flowchart of an optimization algorithm which may be used. In step S11 the algorithm receives or generates an initial population of individuals. Each individual represents one possible set of values that may be used as a solution to a posed problem. For example, if the posed problem is to find a setpoint fingerprint allowing a lithographic apparatus to reach the minimum of a given merit function, then each individual is a different setpoint fingerprint expressed as the weights of Zernike polynomials. An individual may comprise other values or combinations of values. For example, an individual may comprise both a setpoint fingerprint and a set of numerical weights present in the considered merit function. An individual may comprise values referring to different lithographic apparatuses. For instance, if one wants to minimize the Z2 and Z3 spread of three lithographic apparatuses, changing independently the setpoint fingerprint for each of the three apparatuses, then each individual is a set of three setpoint fingerprints (one for each lithographic apparatus).

Processing passes from step S11 to step S12. The optimization algorithm comprises a fitness function, which may alternatively be referred to as optimization function. The term 'merit function' is sometimes used instead of fitness function in the context of optimization algorithms, but is not used in this document in order to avoid confusion with the existing use of the term 'merit function' in this document. The fitness function determines how appropriate (or 'fit') an individual is for solving the posed problem. The posed problem may for example be how to minimize the spread of Z2 and Z3 in a set of lithographic apparatuses. In step S12 the fitness function provides a score for each individual of the initial population that reflects how good a solution each individual is for the posed problem according to the fitness function. The particular way in which the fitness function operates will depend upon the nature of the problem that the evolutionary algorithm is to solve. In one example embodiment, the fitness function in step S12 may determine how good the Z2 and Z3 spread of three lithographic apparatuses is by assessing the spreads for a fixed merit function.

In step S13 the score that was assigned by the fitness function to the best individual of the initial population is evaluated to see if it is satisfactory. If the score assigned to the best individual of a population is satisfactory then the best individual is the desired solution to the posed problem. If the score assigned to the best individual of the initial population is not satisfactory then a new population is produced (as described below). Whether a score is satisfactory or not may be determined on comparison with a pre-determined score. Alternatively the optimization algorithm may output the best individual of a population after a pre-determined time or after a pre-determined number of populations of individuals have been produced or after a pre-determined number of population generation processes have been applied to the populations. The optimization algorithm may output the best individual of a population after any desired limit is reached and/or any desired result is achieved.

In step S14 a new population of individuals is generated. The optimization algorithm may for example be an evolutionary algorithm, in which case the evolutionary algorithm "evolves" the population of individuals via known processes such as reproduction, mutation, recombination and selection. For example, the individuals with the best scores may be selected for reproduction with each other to produce new individuals. Alternatively, some individuals can be stored and not take part in reproduction. New individuals may be produced via an existing individual experiencing a random change, i.e. a mutation. New individuals may be produced via recombination occurring between more than one parent individual. The evolutionary algorithm repeats these processes until a next generation population of individuals is produced. The processes may be repeated for a pre-determined amount of time. The processes may be repeated until a pre-determined number of processes is reached. The processes may be repeated until a pre-determined number of populations have been generated.

The optimization algorithm may for example be a simulated annealing algorithm, in which case the simulated annealing algorithm moves to neighbouring individuals in a search space using operations similar to mutation or crossover in evolutionary algorithms. In this way a new population of individuals is produced. In simulated annealing the probability density function may be the Boltzman probability density function, or may be some other probability density function. The annealing algorithm may comprise fast annealing, Boltzman annealing or some other form of annealing. A temperature update function of the annealing algorithm may be a fast update function, the Boltzman update function, an exponential update function or some other update function. Adaptive simulated annealing (ASA) may be used. If adaptive simulated annealing is used then reannealing may take place after a predetermined number of iterations, may take place after the current state has been replaced a predetermined number of times, or may take place according to some other predetermined interval.

In step S15 the fitness function provides a score for each individual of the new population of individuals. For example, this can be achieved using a merit function determined by the evolutionary algorithm, with the output being assessed using the fitness function.

In step S16 the score that was assigned by the fitness function to the best individual of the population is evaluated to see if it is satisfactory. If the score assigned to the best individual of a population is not satisfactory then processing returns to step S14. The population is evolved again, or simulated annealing is used, to generate a new population.

If the score assigned to the best individual of a population is satisfactory then processing passes to step S17 and the best individual is output as the desired solution to the posed problem.

Using an optimization algorithm is advantageous because it provides a reasonable balance between good optimization and computational resources (determined by the number of calculations which need to be performed). In one embodiment the merit function of each lithographic apparatus may comprise around 4000 aberration data points which vary depending upon around 200 manipulators. Making a single model of for example 10 lithographic apparatuses will create a problem consisting of 40,000 aberration data points which vary depending upon around 2000 manipulators. Generating an optimization using this large combination of data points and manipulators could in some instances be subject to some stability and could require substantial computational resources. However, using an optimization algorithm such as a genetic algorithm, evolutionary algorithm or simulated annealing is computationally relatively light and is inherently stable. An optimization algorithm is well suited to hunt the best weighting of merit function parameters of a set of stable setup models (e.g. for 10 lithographic apparatuses)

A merit function used by embodiments of the invention may be defined as the distance of the worst performing lithographic apparatus from the average aberration fingerprint of all of the lithographic apparatus in a fabrication plant or a subset of these (the average including the worst performing lithographic apparatus). The model calculates adjustments to be applied to that worst performing lithographic apparatus to reduce its distance from the average aberration fingerprint. The effect of the adjustments is calculated and the calculated aberration fingerprint of the worst performing lithographic apparatus is updated. The average aberration fingerprint will also be recalculated. A new calculation is then performed which determines the worst performing lithographic apparatus from the recalculated average aberration fingerprint. This may be the same lithographic apparatus as previously or may be a different lithographic apparatus. The model again calculates adjustments to be applied to that worst performing lithographic apparatus to reduce its distance from the average aberration fingerprint. The calculated aberration fingerprint of the worst performing lithographic apparatus will change, and the calculated average aberration fingerprint will also change. This iterative process is repeated. The iterations may be repeated until no further improvements of the distance of the aberration fingerprints from the average aberration fingerprints are seen by the model. The method may be considered to be an iterative process in which the target of the optimization changes over time. In some embodiments, such as embodiments which use an evolutionary algorithm, the merit function may change during the iterative process.

In the above example the algorithm drives the 'worst' performing lithographic apparatus towards the other lithographic apparatuses. In contrast, the embodiment depicted in FIG. 5 accommodates the situation if the 'worst' lithographic apparatus cannot be improved further. The average population is driven to a different average, such that the overall spread of the systems is minimized. In some embodiments aberrations of the lithographic apparatuses may be measured between iterations, e.g. using a sensor S provided in the substrate table. Where this is done, the worst performing lithographic apparatus may be identified using the measurements and the model may then calculate adjustments to be applied to that lithographic apparatus to reduce its distance from the average aberration fingerprint. In such an embodiment, the average aberration fingerprint will change between measurements, and may be referred to as a moving average.

In another example a specific optical or imaging property (such as overlay) that will be achieved by the different lithographic apparatuses A-E may be selected as the basis for the merit function. Different weightings may be given to different Zernikes. For example, Zernikes (aberrations) which primarily influence overlay, such as Z2 and Z3 and/or other odd Zernikes may be given a greater weighting than Zernikes such as Z4 which primarily influence focus.

Figure 6:
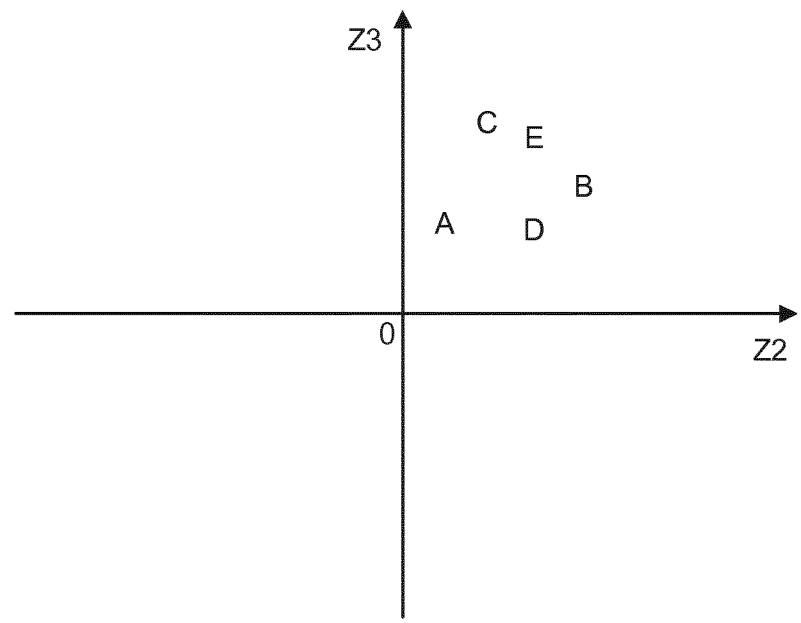
FIGS. 6 and 7 are graphs which schematically depict reductions of the aberrations using a further embodiment of the invention.

Following set up of a lithographic apparatus some properties of the lithographic apparatus may drift over time. For example, the shape of a substrate table of a lithographic apparatus may change very gradually due to wear of the substrate table. In another example, properties of the projection system of a lithographic apparatus may drift over time due to lenses moving slowly in their mechanical supports due to glue drift. As a result of the drift the aberration fingerprints AFA-AFE of the lithographic apparatuses A-E will change over time, and the distance between the aberration fingerprints will increase. This is schematically depicted in FIG. 6, in which it can be seen that distance between aberration fingerprints is greater than in FIG. 4.

Figure 7:
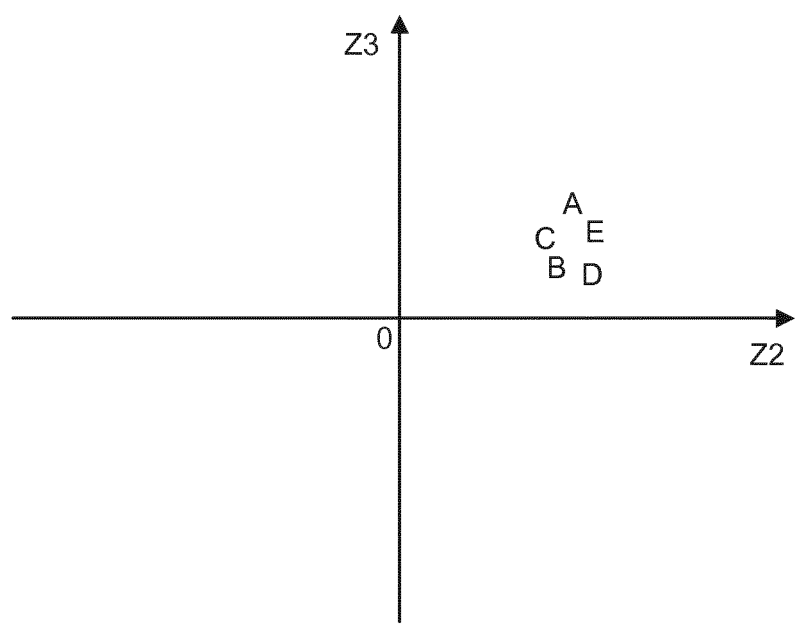

In an embodiment, in order to compensate for the changes in the aberration fingerprints AFA-AFE, the aberration fingerprints are measured periodically. An algorithm is then used to calculate adjustments of the lithographic apparatuses A-E to minimize the distance between the aberration fingerprints AFA-AFE, following which those adjustments are applied. The result is illustrated schematically in FIG. 7. In FIG. 7 the distances between aberration fingerprints AFA-AFE have been reduced, compared with the distances shown in FIG. 6. Reducing the distances between the aberration fingerprints AFA-AFE has increased the value of the Z2 aberration for at least some of the lithographic apparatuses A-E. This may seem to be undesirable, but the advantage obtained by having reduced distances between aberration fingerprints outweighs the disadvantage of the increased Z2 aberration. This is because all of the lithographic apparatuses A-E apply a similar Z2 aberration and as a consequence good overlay between patterns projected by the different lithographic apparatus is achieved.

When compensating for drift of the lithographic apparatuses A-E, an attempt could have been made to bring the aberration fingerprints AFA-AFE back towards their previous values (i.e. attempt to bring them back to the values obtained during setup, as schematically depicted in FIG. 4). However, due to the drift of properties of the lithographic apparatuses A-E it would not have been possible to bring the aberration fingerprints AFA-AFE fully back to those values. As a consequence, the distance between the aberration fingerprints AFA-AFE would not have been minimized. The spread of the aberration fingerprints would have increased, and this would have had a detrimental impact upon the accuracy with which patterns could be projected onto one another (overlay would not be as good as the overlay achieved using the embodiment). By instead using the algorithm to calculate adjustments of the lithographic apparatuses A-E which provide new aberration fingerprints AFA-AFE with minimized differences, a tighter grouping of aberration fingerprints is achieved. This improves the accuracy with which patterns can be projected onto one another (overlay is improved). This is an example of a moving average, because the average of the aberration fingerprints AFA-AFE is changed to a different average when the method is applied.

In an embodiment, one or more reference substrates may be passed through the lithographic apparatuses A-E periodically (e.g. after every 3 days or some other period of time). The reference substrates are exposed and developed. The developed substrates allow the aberrations caused by each lithographic apparatuses A-E to be determined (i.e. allow the aberration fingerprints AFA-AFE to be measured). This information can then be used to calculate adjustments to be applied to each lithographic apparatus which minimize the spread of the aberration fingerprints of the lithographic apparatus.

Periodic adjustments of the lithographic apparatuses A-E to compensate for drift may take a few minutes (e.g. less than 10 minutes), may take a few seconds (e.g. less than 10 seconds), may take less than a second, or may take less than 500 milliseconds.

The adjustments which are applied may be selected based on the time available to apply those adjustments. For example, adjustments which take a few minutes may be applied after measurements have been performed using reference substrates (e.g. at an interval of 1 day or more). An example of such an adjustment is z-direction movement of lens elements of the projection system.

In another example, adjustments which take a few seconds (e.g. 10 seconds or less) may take place during normal production by a lithographic apparatus without affecting throughput. Such adjustments may take place between so called lots of substrates, or take place when the lithographic apparatus swaps a substrate which has been patterned for a substrate which will be patterned. Examples of such adjustments are x or y direction movement of a lens element or mirror, and rotation of a lens element or mirror (e.g. about an x, y or z axis).

In another example, adjustments which take less than 50 milliseconds may take place between exposure of successive target areas. The time taken for the lithographic apparatus to move between successive target areas may be around 50 milliseconds. An example of such an adjustment is tilting selected lens elements of the projection system (the selected lens elements are provided with actuators which are capable of moving the lens elements within 50 milliseconds). An adjustment which is relatively fast (e.g. around 100 milliseconds or less) but which is slower than the time taken to move between successive target areas, may be performed in stages. A first part of the adjustment may be made during a first movement between successive target areas, and the adjustment may be completed during a second movement between further successive target areas. Adjustments may generally be performed in stages, e.g. between several exposures or between exposure of several substrates.

A lens of a lithographic apparatus may be replaced (for example if it is determined that the existing lens is not functioning correctly). The new lens will have a different aberration fingerprint than the old lens. A two-step process may be used to minimize the distances between the aberration fingerprints of the lithographic apparatus. This is illustrated schematically in FIGS. 8 and 9. The lens of the lithographic apparatus C is replaced.

Figure 8:
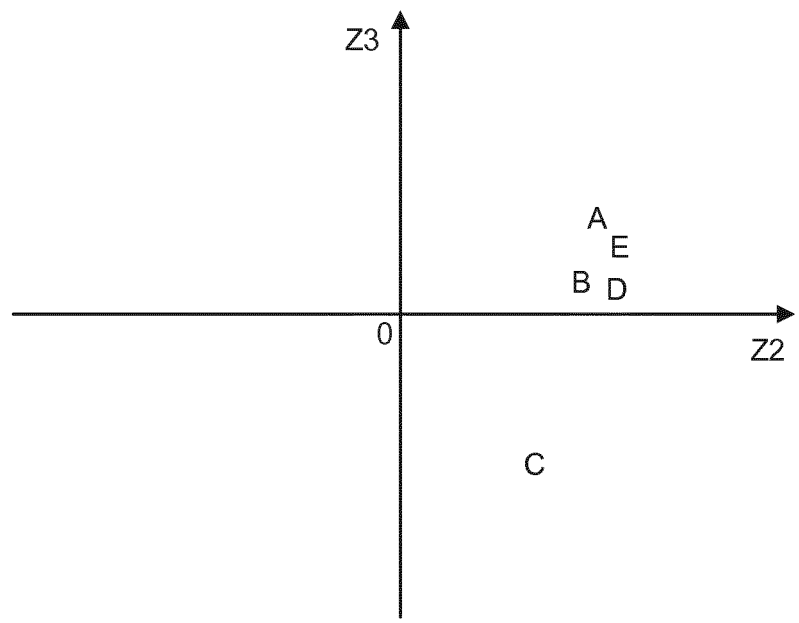
FIGS. 8 and 9 are graphs which schematically depict reductions of the aberrations using yet a further embodiment of the invention.

In a first step, during setup of the lithographic apparatus C with that new lens, adjustments are applied to the lithographic apparatus which minimize the difference between Z2 and Z3 of the lithographic apparatus and an average of Z2 and Z3 of the other lithographic apparatus A, B, D, E. The result is schematically depicted in FIG. 8, where it can be seen that the aberration fingerprint AFC of lithographic apparatus C with the new lens is an outlier compared with the aberration fingerprints AFA, AFB, AFD, AFE of the other lithographic apparatus.

Figure 9:
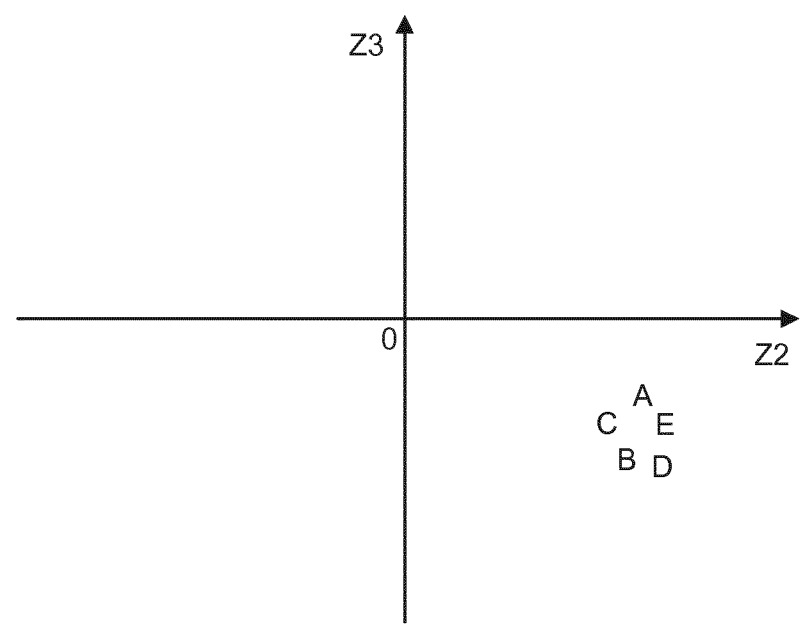

In a second step, the aberration fingerprints AFA-AFE of all of the lithographic apparatus are compared and the algorithm is used to calculate adjustments of the lithographic apparatuses A-E to minimize the difference between the aberration fingerprints. The result is schematically depicted in FIG. 9. In this example the Z3 aberration of the lithographic apparatus C with the new lens has changed slightly, but the Z3 aberration of the other lithographic apparatus A, B, D, E has changed significantly and has become larger for at least some lithographic apparatus. In general, the aberration fingerprint for at least one lithographic apparatus may worsen when minimizing the difference between aberration fingerprints of already operational lithographic apparatus and a lithographic apparatus with a new lens. This is another example of a moving average, because the average of the aberration fingerprints AFA-AFE is changed to a different average when the method is applied.

In an alternative approach, instead of using the above two-step method, a single step method may be used. In the single step method, when setting up the lithographic apparatus C with the replacement lens, aberration fingerprints AFA-AFE for all of the lithographic apparatus which minimize differences between them may be determined and applied as part of the setup process. This may be more difficult to achieve than the two-step method because the lithographic apparatus C which is being set up may have a relatively wide range of potentially achievable ways of reducing aberration values using lithographic apparatus adjustments. It may be difficult to accommodate these in the algorithm alongside a smaller range of potentially achievable reductions of aberration values using lithographic apparatus adjustments for the already operational lithographic apparatus A, B, D, E. This is another example of a moving average.

A method equivalent to the above may be used if a new lithographic apparatus is installed in the fabrication plant. This is another example of a moving average.

Although embodiments of the invention have been described with reference to five lithographic apparatuses, the invention may be implemented for any number of lithographic apparatuses (e.g. all of the lithographic apparatus in a fabrication plant). The lithographic apparatuses to which the method is applied may be referred to as a set of lithographic apparatuses. The term "set" is not intended to limit the number of lithographic apparatuses to any particular number of lithographic apparatuses, and may be interpreted as encompassing two or more lithographic apparatuses. In some embodiments the set of lithographic apparatuses may be a plurality of lithographic apparatuses which are all located in the same semiconductor fabrication plant. In some embodiments the set of lithographic apparatuses may be a plurality of lithographic apparatuses which are used to fabricate a particular integrated circuit. In other words, different lithographic apparatuses of the set of lithographic apparatuses may be used to project different layers onto the same substrate.

The above description refers to adjusting the projection systems of lithographic apparatuses to reduce the difference between aberrations of the lithographic apparatuses. Other properties of the lithographic apparatuses may also be adjusted to reduce aberrations. For example, the separation between the substrate table WT and the projection system PL may be adjusted, the substrate table may be rotated, etc. In another example, the separation between the patterning device MA and the projection system PL may be adjusted, the patterning device may be rotated, etc.

In some embodiments the method may be performed using predicted aberrations. For example a model could be made in which lens manipulators of a set of lithographic apparatuses are misaligned, and the method is then used to steer the modelled lithographic apparatuses back towards each other such that differences between aberration fingerprints are minimized.

In some embodiments, only some of the aberrations of a lithographic apparatus will be measured during a given step of the method. This may be referred to as a partial measured aberration set. Optimization of the lithographic apparatus may be determined using this partial measured aberration set and using previously measured aberrations. The previously measured aberrations are modified to take into account the effect of adjustments which have been applied to the lithographic apparatus after the aberrations were measured, before they are used for the optimization.

Measurement data from all lithographic apparatuses in the fabrication plant (or a subset of lithographic apparatuses) may be stored in a central location together with the current positions of the manipulators of the lithographic apparatuses. The data may be periodically sent from the lithographic apparatuses to the central location and/or may be sent on receiving a request from the central location. A central controller may perform the optimization for all the lithographic apparatuses and output manipulator adjustments to be applied to the lithographic apparatuses. The manipulator adjustments may be received and applied automatically by the lithographic apparatuses.

Embodiments of the invention may use a moving average. For example, an average aberration fingerprint around which the aberration fingerprints of the lithographic apparatuses are grouped may change over time. This provides improved performance (e.g. improved overlay) compared with an approach in which an average aberration fingerprint around which aberration fingerprints are grouped is fixed and does not change. The improved performance is achieved because drift of the lithographic apparatuses over time, e.g. due to wear of the substrate table or gradual movement of lenses, is taken into account.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments of the invention have been described above, it will be appreciated that the invention may be practiced otherwise than as described. The description is not intended to limit the invention.

The invention claimed is:

1. A method comprising:
   determining aberrations caused by each lithographic apparatus of a set of lithographic apparatuses;
   calculating adjustments of the lithographic apparatuses which minimize differences between the aberrations caused by each of the lithographic apparatuses; and
   applying the adjustments to the lithographic apparatuses, such that an average aberration of a first one of the set of lithographic apparatuses is increased after the applying as compared to before the applying.

2. The method of claim 1, wherein the calculating adjustments of the lithographic apparatuses uses a merit function.

3. The method of claim 1, wherein the calculating adjustments of the lithographic apparatuses uses an optimization algorithm.

4. The method of claim 3, wherein the optimization algorithm is an evolutionary algorithm, a genetic algorithm or a simulated annealing algorithm.

5. The method of claim 3, wherein the optimization algorithm modifies the merit function during the calculation of the adjustments.

6. The method of claim 1, wherein the calculating adjustments of the lithographic apparatuses comprises calculating an average of the aberrations caused by all of the lithographic aberrations, determining the worst performing lithographic apparatus, then calculating an adjustment of that lithographic apparatus which brings aberrations caused by that lithographic apparatus closer to the average.

7. The method of claim 1, wherein:
the method is applied during setup of the lithographic apparatuses, and
the aberrations are determined via measurements performed during setup of the lithographic apparatuses.

8. The method of claim 1, wherein the method is applied periodically.

9. The method of claim 8, further comprising using a moving average of the aberrations caused by the lithographic apparatuses.

10. The method of claim 8, wherein:
the method is applied between production exposures of substrates, and
the aberrations are measured periodically.

11. The method of claim 1, wherein the aberrations are measured using a sensor located within the lithographic apparatuses.

12. The method of claim 1, further comprising minimizing differences between the lithographic apparatuses for selected Zernikes.

13. The method of claim 12, wherein weightings are applied to the Zernikes.

14. The method of claim 1, wherein the average aberration of the first one of the set of lithographic apparatuses is increased to match an average aberration of a second one of the set of lithographic apparatuses.

15. A system comprising:
a set of lithographic apparatuses, each lithographic apparatus comprising:
an illumination system configured to provide a beam of radiation;
a support structure configured to support a patterning device, the patterning device serving to impart the radiation beam with a pattern in its cross-section;
a substrate table configured to hold a substrate; and
a projection system configured to project the patterned radiation beam onto a target portion of the substrate;
wherein each lithographic apparatus is adjustable to adjust aberrations caused by the lithographic apparatus when projecting patterns; and
wherein the apparatus further comprises a processor configured to:
determine aberrations caused by each lithographic apparatus of the set of lithographic apparatuses,
calculate adjustments of the lithographic apparatuses which minimize differences between the aberrations caused by each of the lithographic apparatuses, and
apply the adjustments to the lithographic apparatuses, such that an average aberration of a first one of the set of lithographic apparatuses is increased after the applying the adjustments as compared to before the applying the adjustments.

16. The system of claim 15, wherein the average aberration of the first one of the set of lithographic apparatuses is increased to match an average aberration of a second one of the set of lithographic apparatuses.

* * * * *